United States Patent
Lau et al.

(10) Patent No.: US 9,123,741 B2
(45) Date of Patent: Sep. 1, 2015

(54) METAMORPHIC GROWTH OF III-V SEMICONDUCTOR ON SILICON SUBSTRATE BY MOCVD FOR HIGH SPEED III-V TRANSISTORS

(71) Applicant: NANO AND ADVANCED MATERIALS INSTITUTE LIMITED, Hong Kong (CN)

(72) Inventors: Kei May Lau, Hong Kong (CN); Chak Wah Tang, Hong Kong (CN)

(73) Assignee: NANO AND ADVANCED MATERIALS INSTITUTE LIMITED, Kowloon (HK)

( * ) Notice: Subject to any disclaimer, the term of this patent is extended or adjusted under 35 U.S.C. 154(b) by 0 days.

(21) Appl. No.: 13/752,971

(22) Filed: Jan. 29, 2013

(65) Prior Publication Data

US 2014/0209979 A1 Jul. 31, 2014

(51) Int. Cl.
- H01L 29/66 (2006.01)
- H01L 29/778 (2006.01)
- H01L 29/10 (2006.01)
- H01L 29/20 (2006.01)
- H01L 21/02 (2006.01)

(52) U.S. Cl.
CPC ...... *H01L 29/66462* (2013.01); *H01L 21/0262* (2013.01); *H01L 21/02461* (2013.01); *H01L 21/02463* (2013.01); *H01L 21/02502* (2013.01); *H01L 21/02543* (2013.01); *H01L 21/02546* (2013.01); *H01L 21/02584* (2013.01); *H01L 29/1075* (2013.01); *H01L 29/20* (2013.01); *H01L 29/7787* (2013.01)

(58) Field of Classification Search
USPC .......................................................... 257/194
See application file for complete search history.

(56) References Cited

U.S. PATENT DOCUMENTS

| 2,569,347 | A | 9/1951 | Shockley |
| 2004/0124435 | A1* | 7/2004 | D'Evelyn et al. ............. 257/103 |
| 2006/0049427 | A1* | 3/2006 | Takahashi ..................... 257/194 |

OTHER PUBLICATIONS

Li et al ; "0.3um Gate-length Metamorphic AlInAs/GaInAs HEMTs on Silicon Substrates by MOCVD"; 2010 IEEE 978-I-4244-5798-4/10.*
Tang et al, "Hetero-epitaxy of III-V Compounds by MOCVD on Silicon Substrates"; ECS Transactions; 28(5) pp. 227-231 (2010).*
Tang et al, "Hetero-epitaxy of III-V Compounds by MOCVD on Silicon Substrates"; ECS Transactions; 28(5) pp. 227-231 (201 O).*
Tang et al, "Hetero-epitaxy of III-V Compounds lattice matched to InP by MOCVD for device applications"; IEEE 2009; pp. 136-139.*
Li, et al., "Fabrication of 100-nm Metamorphic AlInAs/GaInAs HEMTs Grown on Si Substrates by MOCVD", IEEE Electron Dev. Letters, v. 33, No. 4, p. 498, 2012.

(Continued)

*Primary Examiner* — Cuong Q Nguyen
*Assistant Examiner* — Nishath Yasmeen
(74) *Attorney, Agent, or Firm* — Nath, Goldberg & Meyer; Jerald L. Meyer; Stanley N. Protigal

(57) ABSTRACT

A III-V semiconductor device on a silicon substrate is constructed with a silicon (Si) substrate onto which gallium arsenide (GaAs) indium phosphide (InP) and aluminum indium arsenide (AlInAs) to form a structure of AlInAs over InP over GaAs over Si. The GaAs is applied in at least one layer over the Si, followed by at least one layer of InP and at least one layer of AlInAs. A portion of the structure is doped and a cap or passivation layer is applied.

13 Claims, 15 Drawing Sheets

(56) References Cited

OTHER PUBLICATIONS

Tang et al, "Hetero-epitaxy of III-V Compounds lattice-matched to InP by MOCVD for Device Applications", IPRM, (2009).
Schubert, "Delta doping of IU-V compound semiconductors: Fundamentals and device applications", J. Vac, Sci. Technol. A 8 (3), May/Jun. 1990.
Lau, K.M., et al.; "AlInAs/GaInAs mHEMTs on Silicon Substrates Grown by MOCVD", Dept. of Electronics and Computer Engineering, The Hong Kong University of Science and Technology, Clear Water Bay, Kowloon, Hong Kong.
Tang, C.W., et al., "Hetero-epitaxy of III-V Compounds Lattice-matched to InP by MOCVD for Device Applications", IEEE, pp. 136-139, 2009.
Li, H., et al., "0.3-um Gate-length Metamorphic AlInAs/GaInAs HEMTs on Silicon Substrates by MOCVD", IEEE, 2010.
Tang, C.W., et al., "Hetero-epitaxy of III-V Compounds by MOCVD on Silicon Substrates", ECS Transactions, vol. 28 (5), pp. 227-231, 2010.
Li, M., et al., "Fabrication of 100-nm Metamorphic AlInAs/GaInAs HEMTs Grown on Si Substrates by MOCVD",IEEE Electron Device Letters, vol. 33, No. 4, Apr. 2012.
Salehzadeh, O., et al., "Investigation of the growth of GaAs and InAs/GaAs core/shell nanowires", Dept. of Physics, Simon Fraser University, Burnaby, Canada, Dec. 2010.
"How MOCVD Works, Depositions Technology for Beginners", published by AIXTRON SE, Herzogenrath, Germany, pp. 1-15, May 2011.
Deelman, P.W., et al., "Delta-doped CCDs with integrated UV coatings", Center for Space Microelectronics, Jet Propulsion Laboratory, California Institute of Technology, Pasadena, CA.
Schubert, E.F., "Delta doping of III-V compound semiconductors: Fundamentals and device applications", J. Vac. Sci. Technol. A, vol. 8 (3), pp. 2980-2996, May/Jun. 1990.
"MOVPE Technology and Characterisation of Silicon delta-Doped GaAs and Al[x]Ga[1-x]As", Defense Technical Information Center Compliation Part Notice ADP013779, part of report from an International Journal on the Science and Technology of Condensed Matter Films, vol. 412 Nos. 1-2, Jun. 2, 2002 Proceeding of the Workshop on MBE and VPE Growth, Physics, Technology [4th], held in Warsaw, Poland on Sep. 24-28, 2001.
Lau et al, "AlInAs/GaInAs mHEMTs on Silicon Substrates Grown by MOCVD", IEDM 2008, Dec. 15-17, 2008.

\* cited by examiner

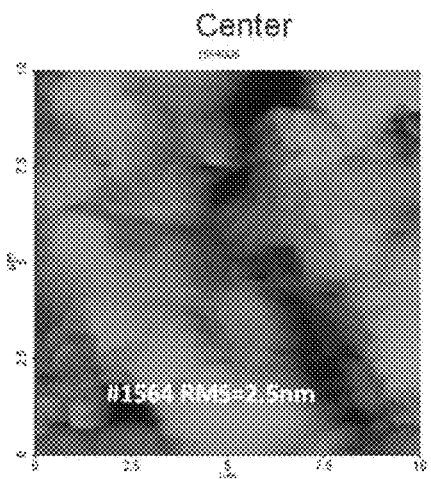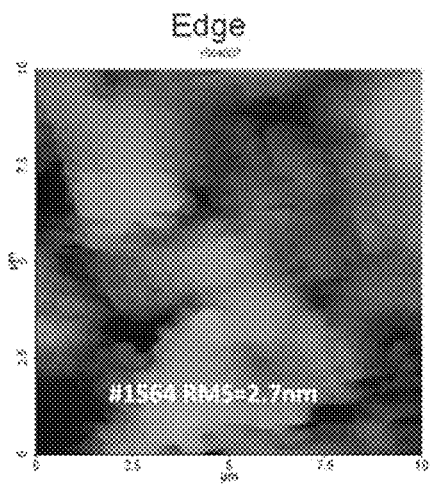
*Fig. 9A*   *Fig. 9B*
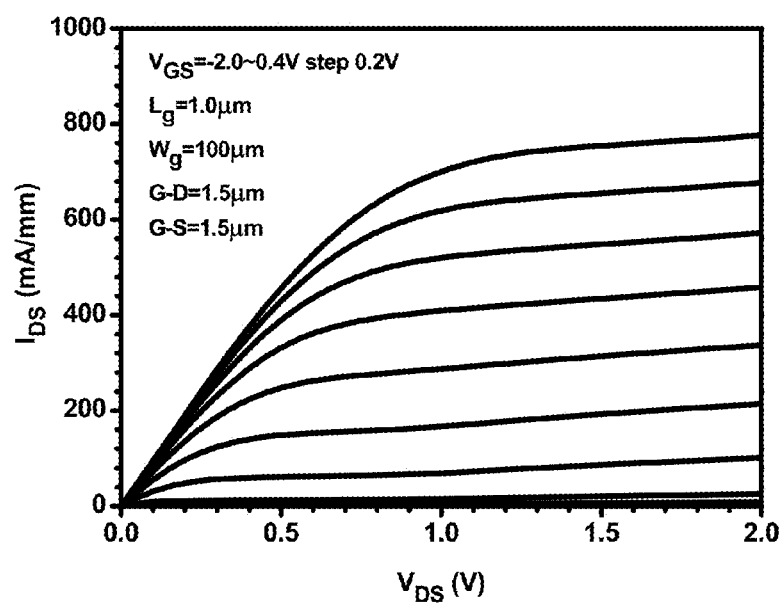
*Fig. 10*

The inset of Fig. 20B

(12) United States Patent
US 9,123,741 B2

METAMORPHIC GROWTH OF III-V SEMICONDUCTOR ON SILICON SUBSTRATE BY MOCVD FOR HIGH SPEED III-V TRANSISTORS

BACKGROUND

1. Field

The present disclosure relates to semiconductor fabrication and more particularly to metamorphic High Electron Mobility Transistor (mHEMT) technology.

2. Background

Metalorganic Chemical Vapor Deposition (MOCVD) is a technique that is used to deposit very thin layers of atoms onto a semiconductor wafer, useful in the manufacture of high speed III-V semiconductor devices. The reference to "III-V semiconductor devices" refers to semiconductor devices using elements from groups III and V of the periodic table of elements, such as transistors based on gallium arsenide (GaAs).

III-V semiconductor devices have advantages over silicon-based semiconductor devices in terms of speed and high gain. Because electrons can move very fast in III-V materials, transistors or devices containing III-V semiconductors are useful in applications which require for high speed and low power logic applications due to its high electron mobility. It allows high-speed and low-voltage logic-circuit-block to couple with the current Si—CMOS platform even for future microprocessor applications. III V Field Effect Transistor (FET) devices exhibit high drive current gain over Si CMOS, it retains the high carrier mobility of the Quantum-well FET. III-V based materials on silicon are under consideration for possible replacement of the Si-CMOS devices in future.

In the MOCVD process, source chemicals are vaporized and transported by hydrogen into the reactor together with other gases at typical reaction pressure, temperature. There, a pyrolysis reaction of the vapors of a volatile metal-organic compound and a gaseous hydride, the critical chemical reaction takes place that turns the chemicals into the desired crystal, which is the III-V compound semiconductor. In one existing technique, the Jesus A. del Alamo group (MIT) leads the technology using Molecular Beam Epitaxy (MBE) apparatus. From his result, the devices on InP substrate with gate width (Lg)=50 nm exhibits threshold voltage ($V_t$)=0.1 V, Peak Gm ($G_{m,max}$)=1.75 mS/μm, fT=465 GHz and the maximum unity current gain cut-off frequency ($f_{Max}$)=1.06 THz at a moderate value of $V_{DS}$=0.75 V by MBE. The industry leader, Intel, announced LG=75 nm $In_{0.7}Ga_{0.3}As$ Quantum-well Field Effect Transistor (QWFET) on Si with composite high-K gate stack achieves high transconductance of 1750 μS/μm and high drive current of 0.49 mA/μm at $V_{DS}$=0.5 V by MBE.

SUMMARY

A III-V semiconductor device is formed on a silicon (Si) substrate, in which the Si substrate is treated to form a stable As—Si prelayer. A first III/V semiconductor layer is applied over the prelayer and a second III/V semiconductor material is applied over the first III/V semiconductor layer. At least one layer of a material having a larger bandgap than said at least one III/V semiconductor layer is applied and at least a portion of the structure is doped.

BRIEF DESCRIPTION OF THE DRAWINGS

The file of this patent contains at least one drawing executed in color. Copies of this patent with color drawings will be provided by the Office upon request and payment of the necessary fee.

FIGS. 9A and 9B are an AFM images of a scan area of buffer structures on a Si substrate at center (FIG. 9A) and edge regions (FIG. 9B) of a wafer.

FIG. 10 is a graphic depiction of DC current-voltage characteristics of a mHEMT.

DETAILED DESCRIPTION

Overview

Figure 1A:
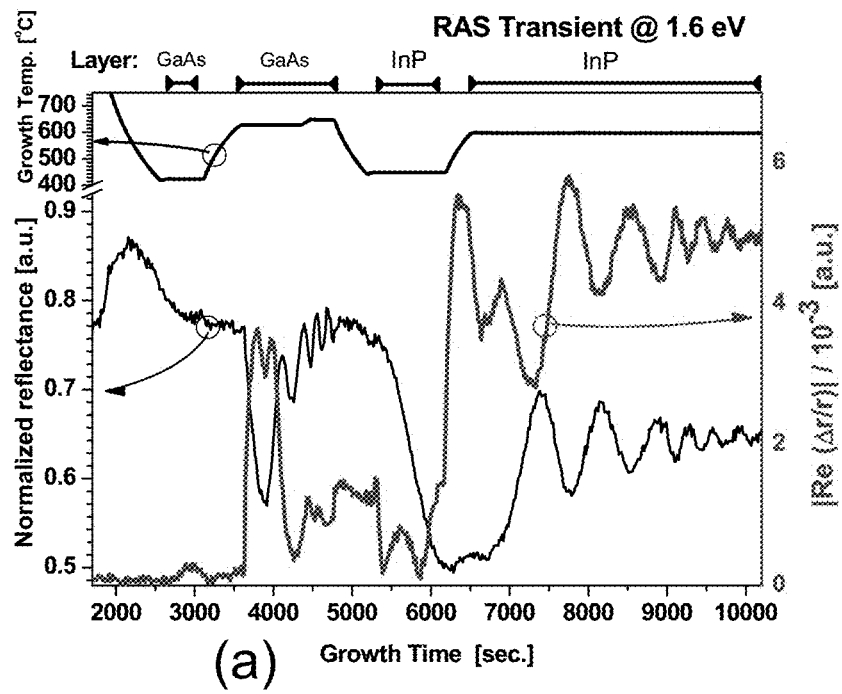
FIGS. 1A-1D are graphical depictions showing RAS transients measured simultaneously to the reflectance transients for a whole device.
Figure 1B:
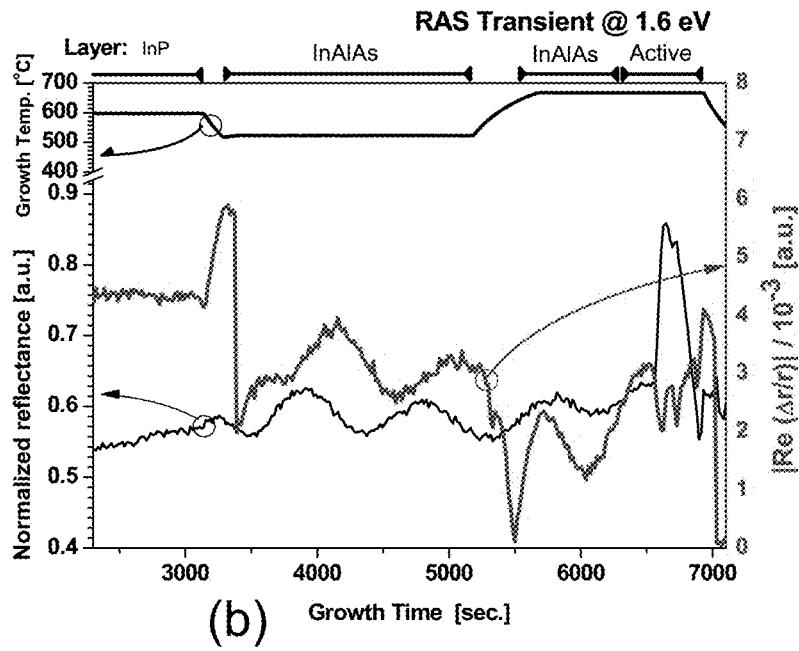

III-V devices are integrated on large area of silicon substrate using metamorphic techniques by Metalorganic Chemical Vapor Deposition (MOCVD). The integration combines the mature Si-based integrated circuit (IC) technology and the advantages of high speed III-V materials, and thereby allows high quality devices to be fabricated on silicon substrates.

Monolithic integration of III-V and IV devices offer improved performance over Si-based devices (Si on Si or silicon fabrication) because the scaling of Si-based ICs has approached the physical limit dimensions of silicon technology. III-V n-channel devices have 30 times higher mobility than Si devices and achieves current gain cut-off frequency (fT)>400 GHz at Vcc=0.5 V. Advantages include low cost and high quality of available commercial 12-inch Si substrates, high speed and high power InP-based circuit integrated with high density Si-based integrated circuit and significant improvement in RF performance. The use of a Si substrate offers good mechanical property and increases the fabrication reliability over that of InP substrates. The thermal conductivity and thermal reliability are very good, and the resultant devices have similar frequency performance in terms of low-noise as is obtained with InP substrate.

A possible alternative is using Molecular Beam Epitaxy (MBE) apparatus for the integration. It is noted that the described techniques can work on both MOCVD and MBE processes. There are two major thin-film equipment types used for III-V semiconductor epitaxial growth using MBE or MOCVD in industrial application. Molecular Beam Epitaxy uses beams of different molecules from their effusion cells to build up layers or materials on top of a substrate by manipulating atoms and molecules at an ultrahigh vacuum chamber and a suitable substrate temperature. Basically, the MOCVD process involves chemical reaction taking place whereas MBE process is a physical material deposition. Both methods can achieve growth of III-V mHEMT structure on wafer.

Metamorphic high electron mobility transistor (mHEMT) technology provides advantages in terms of high speed and high-frequency performance structure on low cost of silicon substrate. The mHEMT is a heterostructure quantum-well field-effect transistor (QW-FET) incorporates a heterojunction consisting of at least two different materials with different band gaps. Because the different band gaps and alignment to each other, band discontinuities occur at the interface. The conduction band offset can form a potential well where confining electrons. Within the well the electrons can only move in a two-dimensional plane parallel to the hetero-interface as referred to a two-dimension electron gas (2DEG). The 2DEG arrangement offers high carrier mobility compared to bulk material. Silicon δ-doping layer, with only few atomic layers thickness are located between the Barrier and Spacer layer, and provides electrons to the channel. The electrons tend to occupy the lower energy state, and drain into the potential well and form the confined 2DEG in the channel. Optimum highly δ-doping level provides high electron densities in the channel and therefore results in high transconductances, current densities and cut-off frequencies which results in higher frequency response and higher power efficiency.

In one experiment, a device was fabricated on a silicon substrate with 100 nm gate-length to form a depletion-mode metamorphic high electron mobility transistor (mHEMT). The fabricated device exhibited a saturated peak DC transconductance of 767 mS/mm and the unity current gain cut-off frequency ($f_T$) of 210 GHz at $V_{DS}$=1.0 V and $V_{GS}$=0 V and the maximum oscillation frequency ($f_{max}$) is 146 GHz.

Material Growth and Device Fabrication

Ga 0.47 In 0.53As quantum well (QW) channel HEMT device layers nearly lattice-matched to InP were grown on silicon substrates using Aixtron AIX-200/4 MOCVD system with EpiRAS-2000 installed for optical in-situ monitoring. All the substrates used were standard 4-inch exact-(100) n or p-type Si. Two-step growth technique was utilized in this experiment. Over six-ninth grade of trimethylgallium (TMGa) or triethylgallium (TEGa), trimethyl indium (TMIn), arsine (AsH3) and phosphine (PH3) were used as gallium, indium, arsenic and phosphide precursors. Prior to growth, the silicon wafer was cleaned and de-oxidized by ammonium hydroxide and hydrogen peroxide mixture ($NH_4OH:H_2O_2$) or sulfuric acid and hydrogen peroxide mixture ($H_2SO_4:H_2O_2$) and diluted hydrofluoric acid (HF), respectively. After loading into the reactor, the substrate was heated up to 850° C. for thermal cleaning. Afterwards it was cooled down to approximately 425° C. (or approximately 400° C. for TEGa) for the low temperature (LT) GaAs nucleation layer growth. During the substrate temperature cooling within 850° C. to 600° C., under $H_2$ ambient with reactor pressure nominal at 100 mbar, arsine was introduced into the reactor. The pre-treatment process is important for GaAs on silicon since silicon is a non-polar material which is different from the polarity material as GaAs, InP, and similar materials. Flowing arsine could help forming double monolayer steps on silicon surface as well as a stable As—Si prelayer, which can prevent Anti-phase Domain (APD) formation. The preferred range of reactor pressure is 10 mbar to 1 bar, with a more preferred range being 50 mbar to 500 mbar.

The As—Si layer is the first prelayer or interfacial layer, but is not the initial buffer. The growth temperature of the composite buffer layers varied from 425° C. to 670° C. (or 400° C. to 670° C. for TEGa). The first LT-GaAs nucleation thickness is controlled and interrupted at approximate 10 nm-thick and then the reactor temperature ramp up to approximately 630° C. to continuous grow the first high temperature (HT) GaAs buffer that has approximately 450 nm-thick. Following, the reactor temperature is cooled down to approximately 450° C. for the second buffer of LT-InP grown with around 150 nm-thick. The next step is increasing reactor temperature to 600° C. to grow the third buffer of HT-InP with approximate 750 nm-thick. To improve the buffer resistivity, we will grow the fourth buffer, undoped LT-$Al_{0.47}In_{0.53}As$, on top with approximate 180 nm at the approximately reactor temperature of 525° C. and then ramp up to approximately 670° C. to grow the fifth buffer of high quality undoped $Al_{0.47}In_{0.53}As$ layer with 120 nm-thick. The active layers were grown at a substrate temperature of approximately 670° C. Depletion-mode Al 0.50 In 0.50As/Ga 0.47 In 0.53As mHEMTs were fabricated. The device gate length was 1.0 μm and the spacing between gate-source and gate-drain were both 1.5 μm. 0.3 μm-gate-length mHEMTs were also obtained for comparison. For the fabrication, mesa isolation was formed by wet chemical etching down to the low-temperature (LT) grown Al In As buffer. A six-layer metal (Ni/Ge/Au/Ge/Ni/Au) was evaporated to form source/drain ohmic contacts. The metal contacts of source/drain consists of the sequential metal deposition of Ni, Ge, Au, Ge, Ni, Au, deposited by electron beam vaporization. The non-alloyed ohmic contact resistance Rc was determined to be 0.065 Ω-mm by the TLM method. Gate recess was formed using a citric acid-based etchant to remove the highly-doped Ga—In—As cap layer. The highly n-doped Cap layer helps minimize the contact resistance of the source drain contacts. The cap also provides protection from oxidation for the sensitive InAlAs barrier layer underneath.

Finally, Ti/Pt/Au was deposited to form a Schottky gate contact. No passivation was used on the devices. The total thickness of the composite buffer is about 1.6 μm or less. The growth of the device is depicted in Table 1, which shows a layered structure of mHEMT on Si substrate structure grown on silicon substrate: The sequential buffer layers is to accommodate the lattice mismatch from silicon to Indium phosphide (InP) materials and overcome the differences of thermal expansion coefficients between them. It is the function of buffer 1 to 3. The buffer 4, LT-AlInAs buffer grown at has high resistivity and can serve as a good isolator for the active device. The HT-AlInAs (buffer 5) was then grown to improve the crystalline quality for the channel layer on top.

TABLE 1

Layered structure of mHEMT on Si substrate structure grown on silicon substrate (n-type Si).

| | |
|---|---|
| $Ga_{0.47}In_{0.53}As$: Si, $(5 \times 10_{18})$ cm$^{-3}$, 15 nm | cap layer |
| Udoped$Al_{0.50}In_{0.50}As$, 30 nm | barrier |
| Si δ-doping (4-8) × $10^{12}$ cm$^{-2}$ | delta doping |
| Undoped $Al_{0.50}In_{0.50}As$, 5 nm | spacer |
| Undoped $Ga_{0.47}In_{0.53}As$, 32 nm | channel |
| Undoped HT - $Al_{0.50}In_{0.50}As$, 120 nm | buffer 5 |
| Undoped LT - $Al_{0.47}In_{0.53}As$, 180 nm | buffer 4 |
| Undoped HT - InP, 730 nm | buffer 3 |
| Undoped LT - InP, 150 nm | buffer 2 |
| Undoped HT - GaAs, 450 nm | buffer 1 |
| Undoped LT - GaAs, 10 nm | nucleation |
| n-type silicon (100) substrate | substrate |

Figure 1C:
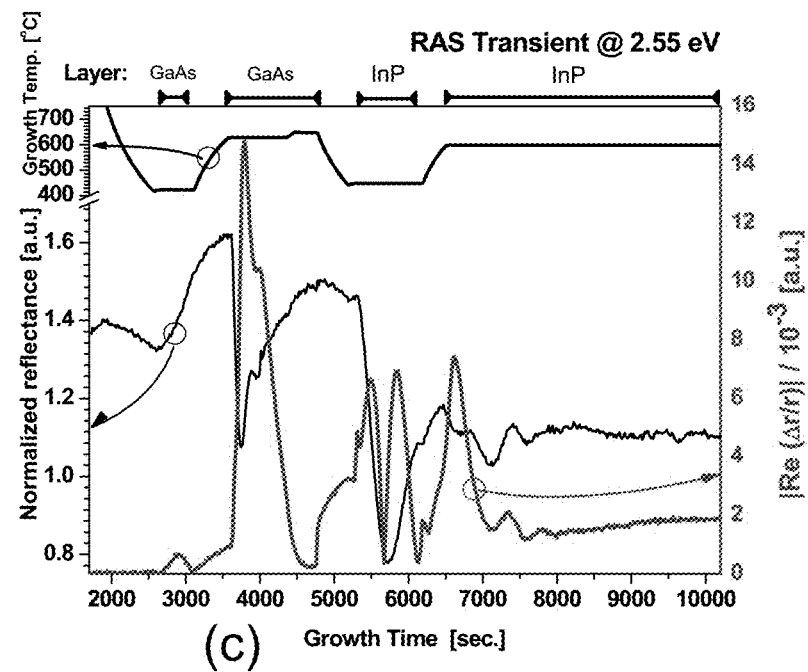
Figure 1D:
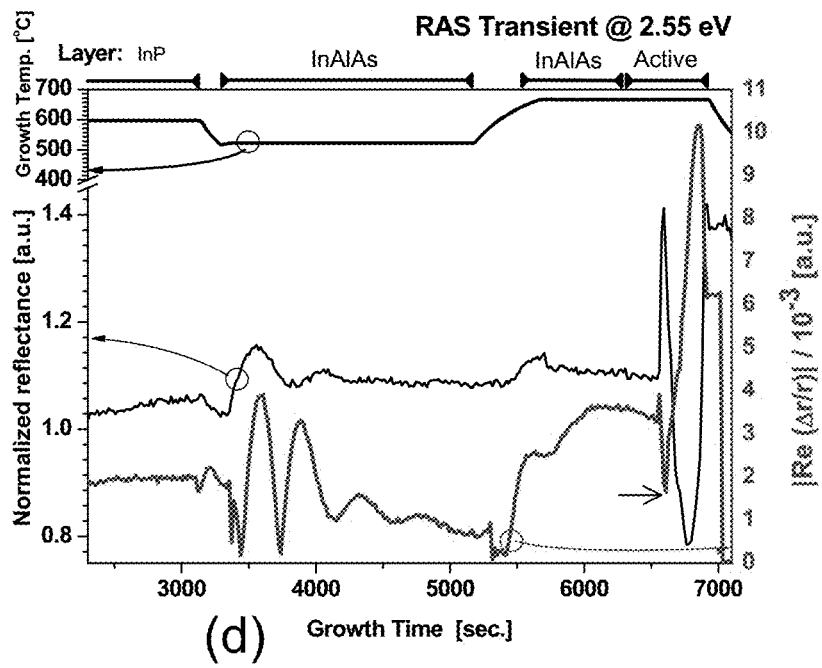

FIGS. 1A-1D are graphical depictions showing RAS transients measured simultaneously to the reflectance transients for a whole device. FIGS. 1A and B show a set of transients at 1.6 eV. FIGS. 1C and D show a set of transients at 2.55 eV. The growth of the device structure was monitored by using the Colorplot mode in an EpiRAS in-situ monitoring system. The growth process was monitored using the color plot mode in an EpiRAS in-situ monitoring system, with detection by means of RAS scans made at two wavelengths: 1.6 eV and 2.55 eV. The detection is made at 1.6 & 2.55 eV for realtime monitor the growth condition. For GaAs or InP based materials, it shows low absorption and high penetration at 1.6 eV that can reflect the material crystal properties. It has stronger absorption at 2.55 eV that can reflect the material surface morphology or roughness.

The delta doped regions (δ-doping) are formed by flowing silane gas through the III-V semiconductor surface at typical pressure, temperature and time for MOCVD processes. Silicon δ-doping layer, with only one or few atomic layers thickness where located between the Barrier and Spacer layer. MOCVD is used to introduce dopants by flowing a certain amount of of $SiH_4$ gas at a precisely controlled time to place a single or few atomic plane of Silicon dopant atoms. This type of incorporation of dopant atoms into crystalline structure of semiconductor material modifies its electronic structure by bending the conduction or valence band edges to form a V-shaped potential well. The electrons confined in this potential well are regarded as a two-dimensional electron gas.

As absorption of GaAs or InP based materials are significantly different at these wavelengths (low absorption at 1.6 eV, strong absorption at 2.55 eV, the shape of the Fabry-Perot oscillations are considerably different. The high energy measurement (2.55 eV) is also much more sensitive to the surface morphology and roughness.

Material Growth Study

Figure 2:
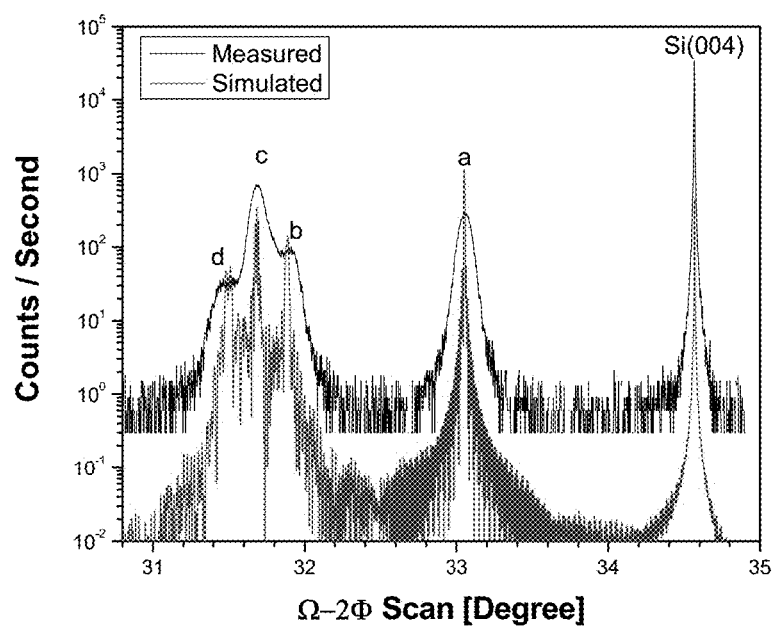
FIG. 2 is a diagram showing show the material and compositional characterization by High resolution X-Ray Diffraction.

FIG. 2 is a diagram showing show the material and compositional characterization by High resolution X-Ray Diffraction. The upper waveform is measured data and the lower waveform is simulated data.

The HEMT structure was characterized by 4 crystal high-resolution X-Ray Diffraction. Philip's X'Pert Epitaxy simulator was used for the curve fitting in FIG. 2. The buffer effectively accommodates the lattice mismatch between the HEMT devices and the silicon substrate. Peaks a, b, c, d represent the existing of epitaxial layers on substrate which is corresponding to the GaAs, LT-$Al_{0.52}In_{0.48}As$, InP and HT-Al0.44In0.56As, respectively. All peaks are clearly resolved. This is different from MBE growth in which graded buffer was used. To match the measured and fitting peaks position, it shows the peaks a and c have a relaxation of +102% and +101% respectively, indicating the residual tensile stress caused by thermal mismatch. The FWHM of InP peak is around 320 arcsec. The value is similar to our device on GaAs substrate with similar value, implying a similar quality to InP on GaAs substrate.

Hall mobility measurements using Van Der Pauw method were carried out at 300K and 77K to ascertain the quality of the 2-DEG, as signified by its amount of enhancement at 77K. The corresponding electron mobilities of mHEMT structure, with device results in this report, were 4540 and 14,000 cm$^2$/V-s with sheet carrier densities of $8\times10^{12}$ cm$^{-2}$ and $5\times10^{12}$ cm$^{-2}$ at 300K and 77K, respectively.

Figure 3:
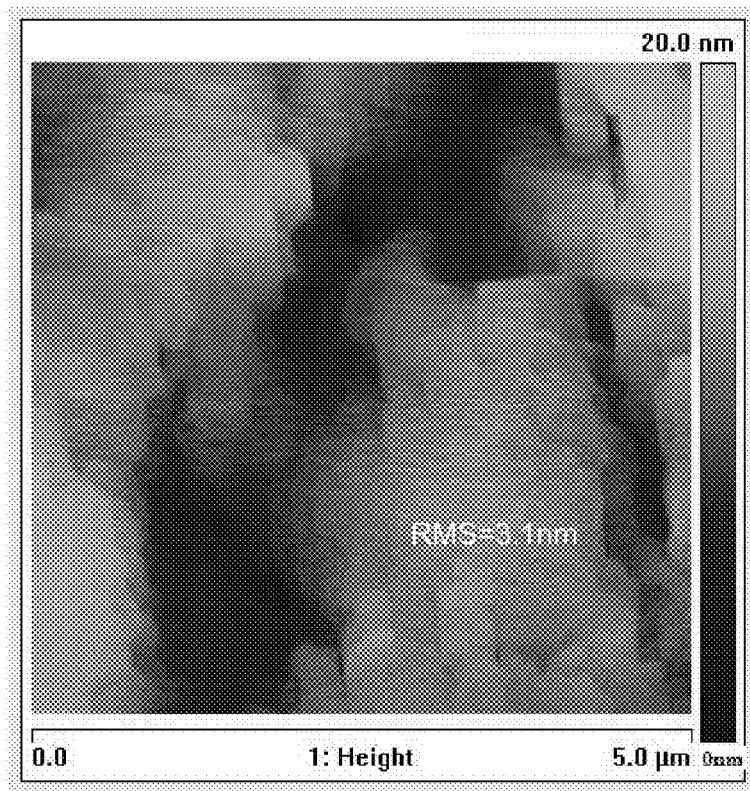
FIG. 3 is an AFM image of the typical metamorphic high electron mobility transistor (mHEMT) structure.

FIG. 3 is an AFM image of the typical mHEMT structure, showing a 5×5 μm$^2$ scan area of $Ga_{0.47}In_{0.53}As$ QW layer. The Root Mean Square (RMS) value of surface roughness is 3.1 nm across a scan area of 5×5 μm$^2$, which is somewhat rougher than that of similar structure grown on GaAs substrate. Large islands can be observed from the AFM micrograph, which is different from the surface morphology by MBE where the cross-hatching surface texture is presented. The difference is due to the different relaxation mechanism; the mismatch is accommodated by low temperature nucleation buffer in our case while graded Al—In—As buffer in help releasing the stress gradually.

Figure 4:
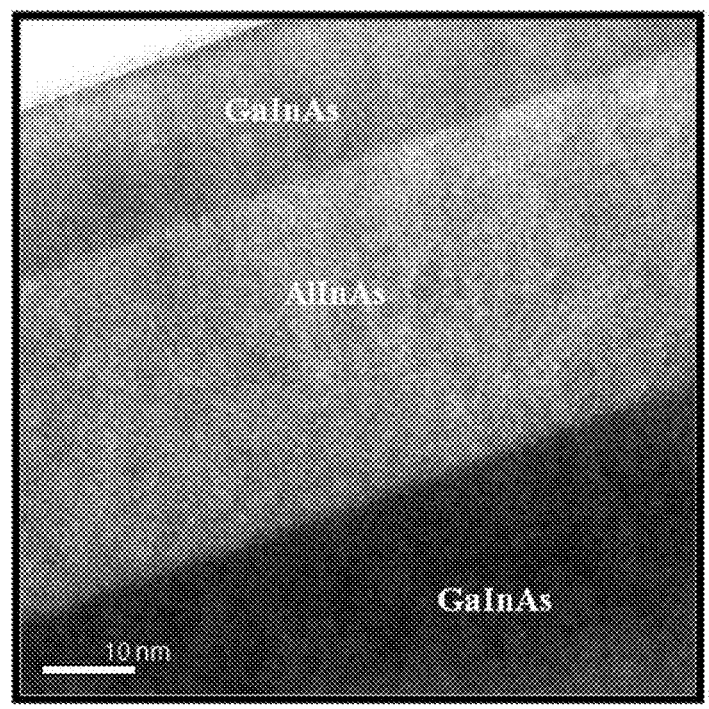
FIG. 4 is a TEM image showing a cross section image about the active layer.

FIG. 4 is a TEM image showing a cross section image about the active layer. The threading dislocation is estimated lower than $5\times10^7$ cm$^{-2}$.

Epitaxial Growth Improvement of mHEMT on Silicon Substrate

A thin strain GaInAs layer is inserted between buffer 2 and 3 to enhance the material quality. The AFM image of the effective composite buffer surface morphology, demonstrates a quite smooth surface has been achieved with the RMS roughness of surface around 2.5 nm across a scanned area of 10×10 μm$^2$.

Figure 5:
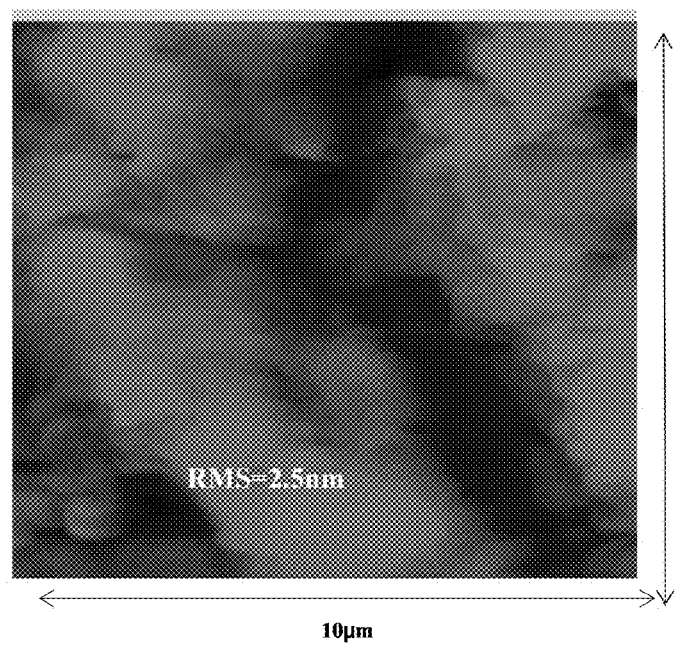
FIG. 5 is an AFM image of buffer structures on a Si substrate.
Figure 6A:
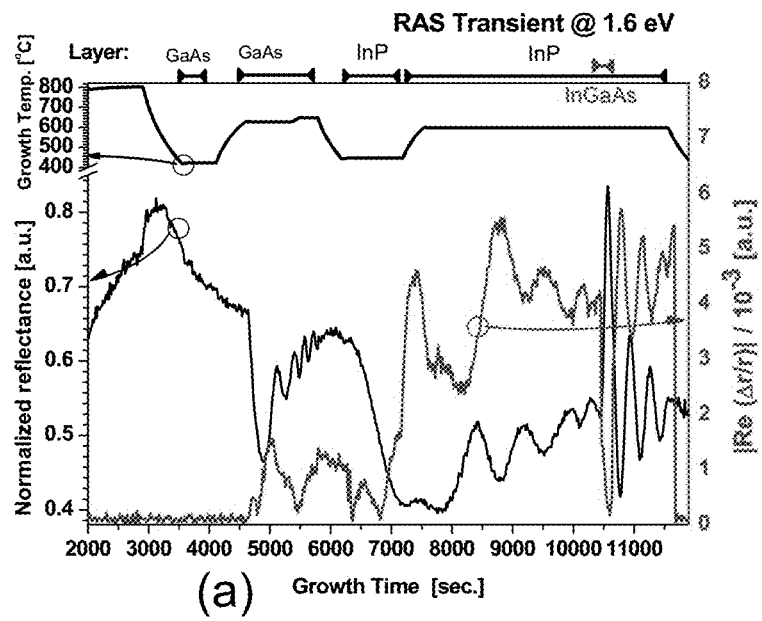
FIGS. 6A-6D are graphical depictions showing RAS transients measured simultaneously to the reflectance transients for an improved device structure.
Figure 6B:
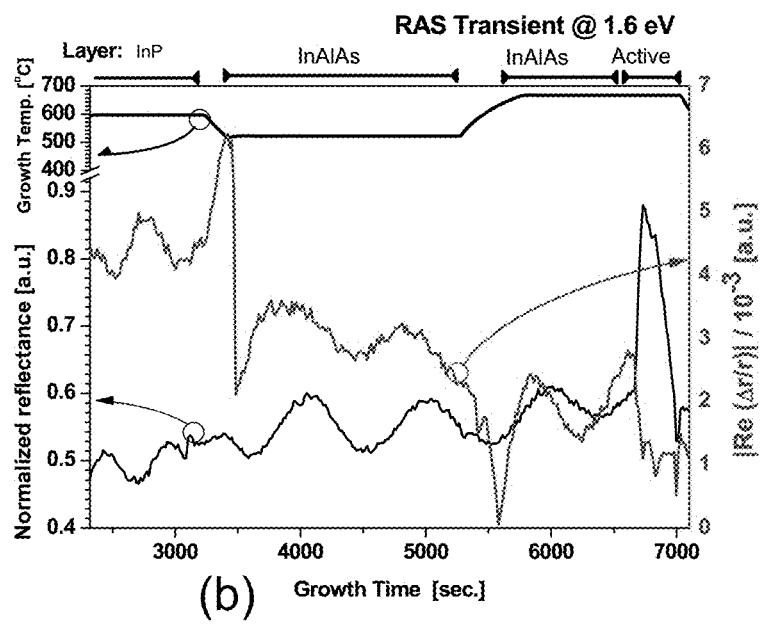
Figure 6C:
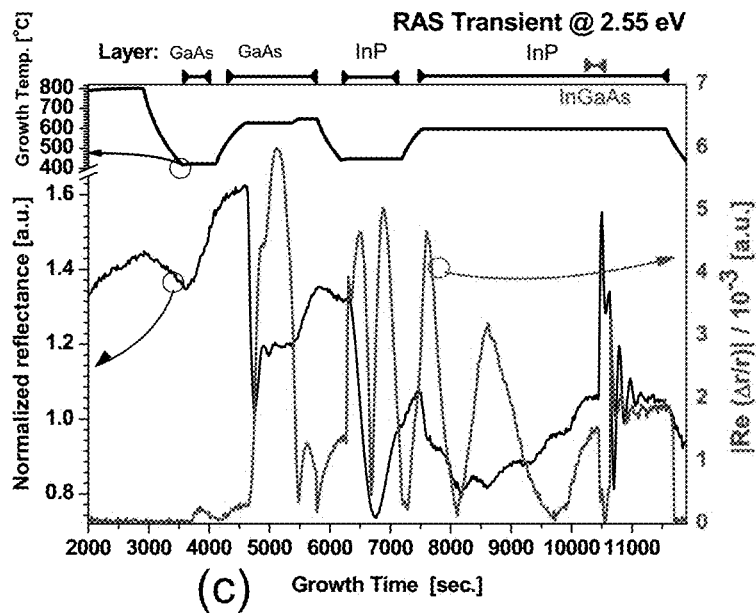
Figure 6D:
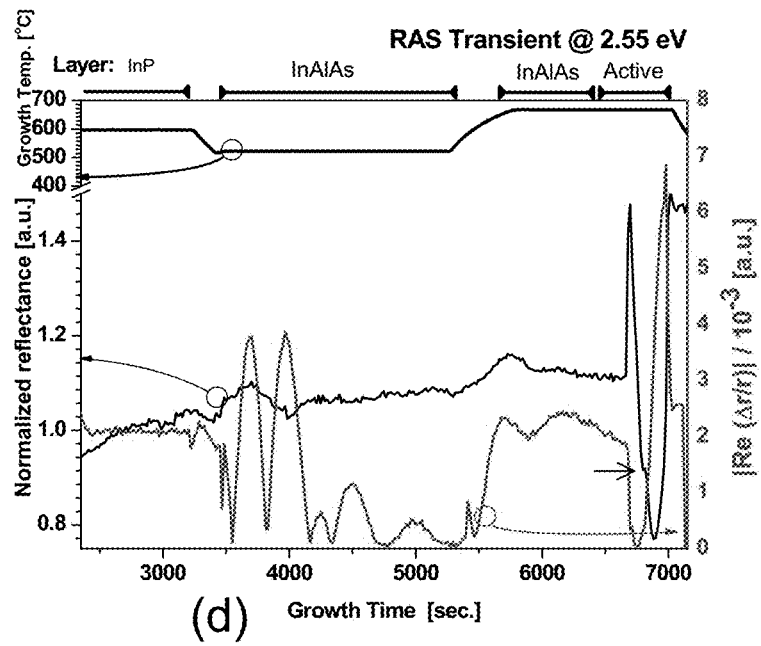

FIG. 5 is an AFM image of 10×10 μm$^2$ scan area of buffer structures on a Si substrate. The structure is constructed as described in Table 2:

TABLE 2

Layered structure of mHEMT on Si substrate structure grown on silicon substrate (p-type Si).

| | |
|---|---|
| N++$Ga_{0.47}In_{0.53}As$: $(7 \times 10_{18})$, 20 nm | cap layer |
| Udoped$Al_{0.49}In_{0.51}As$, 25 nm | barrier |
| Si δ-doping $(6 \times 10^{12}$ cm$^{-2})$ | delta doping |
| Undoped $Al_{0.49}In_{0.51}As$, 5 nm | spacer |
| Undoped $Ga_{0.47}In_{0.53}As$, 30 nm | channel |
| Undoped HT - $Al_{0.49}In_{0.51}As$, 120 nm | buffer 5 |
| Undoped LT - $Al_{0.49}In_{0.51}As$, 180 nm | buffer 4 |
| Undoped HT - InP, 425 nm | buffer 3 |
| Undoped $Ga_{0.4}In_{0.6}As$, 30 nm | strain |
| Undoped LT - InP, 425 nm | buffer 2 |
| Undoped HT - GaAs, 425 nm | buffer 1 |
| Undoped LT - GaAs, 10 nm | nucleation |
| p-type silicon (100) substrate | substrate |

FIG. 6A-6D are graphical depictions showing RAS transients measured simultaneously to the reflectance transients for an improved device structure. These figures depict the characteristics of the EpiRAS monitor signal.

Figure 7:
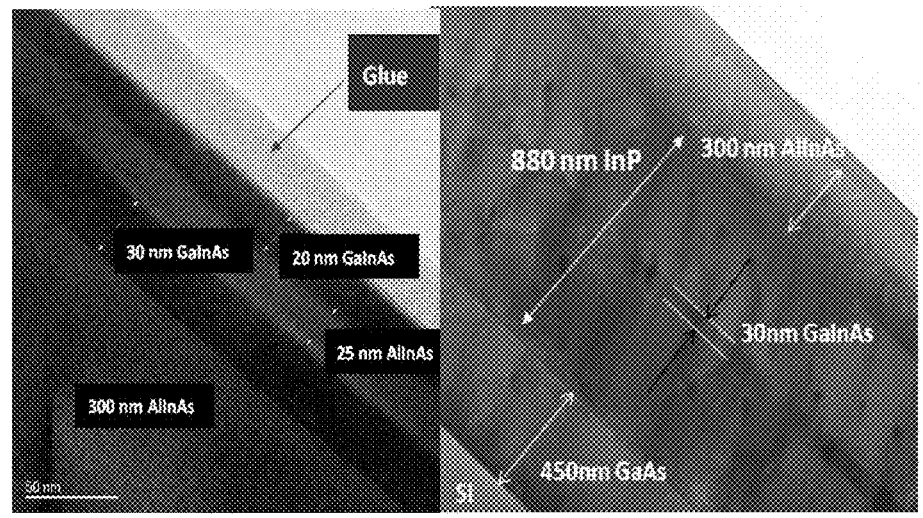
FIG. 7 is a combination of cross-sectional TEM images of the entire heterostructure (right-side) and the active layers (left-side).

FIG. 7 depicts a combination of cross-sectional TEM images of a mHEMT structure, showing the entire heterostructure (right-side) and the active layers (left-side). The 30 nm $Ga_{0.4}In_{0.6}As$ layer effectively balances the strain in the composite buffer. There are only few misfit dislocations and 60-degree threading dislocations confined in the buffer.

After removing the cap layer, a room-temperature (RT) Hall measurements showed a 2DEG density of $4.5\times10^{12}$ cm$^{-2}$ with a mobility of 7500 cm$^2$/V·s at 300K, and $3\times10^{12}$ cm$^{-2}$ with a mobility of 23,000 cm²/V–s at 77K. The measurements indicated good quality of this composite buffer on silicon substrate.

New Growth Parameter (Using TEGa as Ga Source)

Comparing with TMGa, TEGa has higher vapor pressure, low cracking temperature. The growth scheme is as follows:

LT-GaAs: 400° C.
HT-GaAs: 550° C. to 650° C.
LT-InP: 450° C.
HT-InP: up to 600° C. with 3 nm-InGaAs layer insertion at the middle.

From the high-resolution XRD measurement, the FWHM of InP and GaAs is 285 arcsec. and 293 arcsec., respectively, by Omega-2theta scan.

Figure 8:
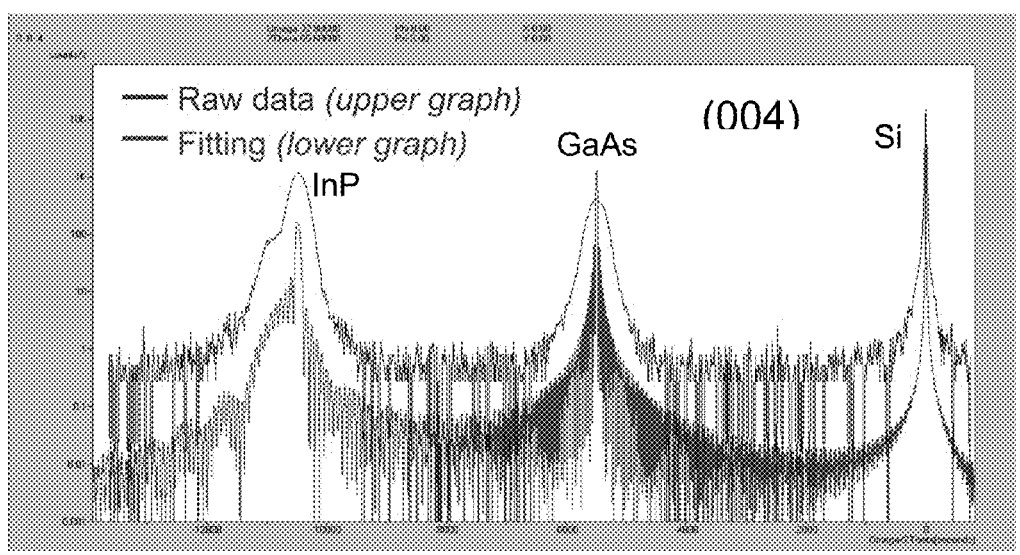
FIG. 8 is an HR-XRD characterization of metamorphic buffer on Si(004).

FIG. 8 is an HR-XRD characterization of metamorphic buffer on Si(001) The upper waveform (blue) is raw data, indicated as 1564.D01, and the lower waveform (red) is a "fitting" characterization for 1564 InP on Si. (1564 is the sample number.) The characterization demonstrates the insertion of thin 30 nm-InGaAs layer, we achieve good crystallinity of InP and GaAs on top of silicon substrate by HR-XRD measurement result that the FWHM of InP and GaAs is 285 arcsec. and 293 arcsec., respectively, by omega-2theta scan.

HEMT structure was grown on this buffer. After removing the cap layer, a room-temperature (RT) Hall measurements showed a 2DEG density of $5.4\times10^{12}$ cm$^{-2}$ with a mobility of 8140 cm²/V–s at 300K, and $4.6\times10^{12}$ cm$^{-2}$ with a mobility of 30,400 cm²/V–s at 77K. This result indicates the quality of the composite buffer on silicon substrate was improved greatly.

Figure 11:
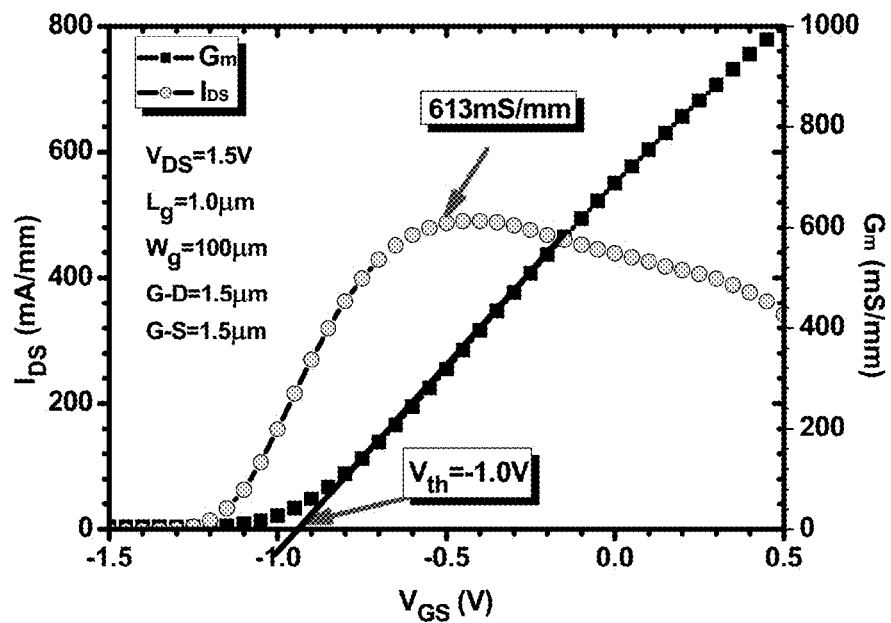
FIG. 11 is a graphic depiction of transfer characteristics of a mHEMT.
Figure 12:
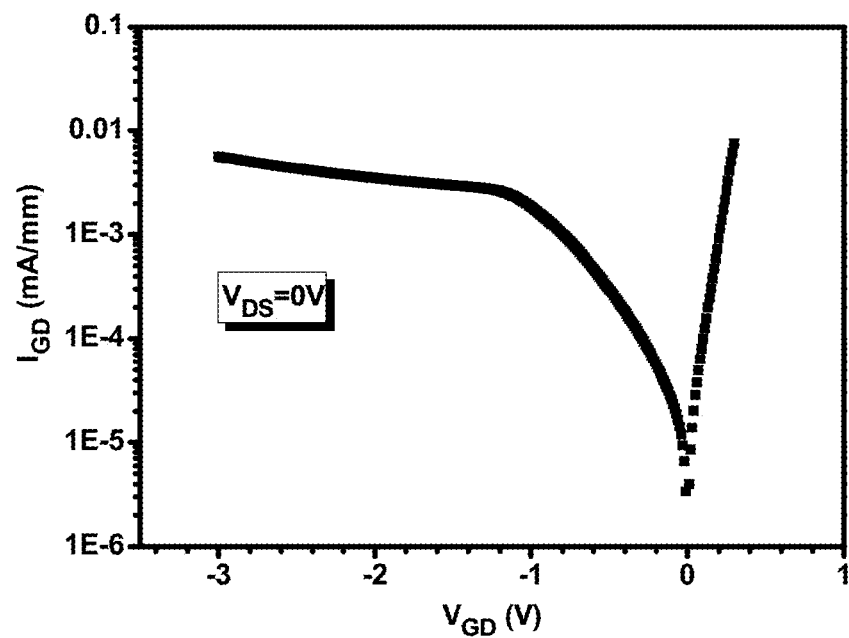
FIG. 12 is a graphic depiction of gate leakage current characteristics of a mHEMT.

From the AFM image, the buffer shows a smooth surface with RMS roughness around 2.5 nm across a scanned area of 10×10 μm² at the center and slightly rough at edge region around 2.7 nm FIGS. 9A and 8B are an AFM images of a 10×10 μm² scan area of buffer structures on a Si substrate at center (FIG. 9A) and edge regions (FIG. 9B) of a wafer. FIG. 10 is a graphic depiction of DC current-voltage characteristics of a 1.0×100 μm² mHEMT. FIG. 11 is a graphic depiction of transfer characteristics of a 1.0×100 μm² mHEMT. FIG. 12 is a graphic depiction of gate leakage current characteristics of a mHEMT at $V_{DS}$=0V.

Fabrication process of mHEMT on silicon substrate is performed in the following sequence:

The fabrication process of mHEMT on Silicon substrate can be accomplished in the following steps:

1. Clean the wafer using acetone and isopropyl alcohol (IPA).
2. Photolithography (AZ703): 1000 rpm/5 s;
3. PR spin coat: 4000 rpm/30 s; 90 deg/60 s; Exp./7 s; 110 deg/60 s; FHD-5/60 s; The thickness of PR is approximate 9000 A;
4. Hard bake (120°/15 min); De-scum (O₂/0.7 min/70°/400 W).
5. Etching with etch solution: $H_3PO_4/H_2O_2/H_2O$ (3:1:50): 85 s; Mesa etching: Citric acid/$H_2O_2$ (1:1):60 s.
6. The mesa height: approximate 1750 A.
7. Gate recess: using acid-based etchant to remove the n-InGaAs cap layer.
8. Gate metal: Ti/Pt/Au (30/20/250 nm) deposition and lift-off
9. Non-alloyed S/D ohmic contacts.
10. The spacing between gate-source and gate-drain were both 1.5 μm.
11. Source, Drain metal: using a six-layer metal scheme, Ni/Ge/Au/Ge/Ni/Au.
12. The specific contact resistivity (ρc) was determined to be $4.5\times10^{-7}$ Ω·cm² by using transmission-line matrix (TLM) technique.

FIG. 11 is a diagram showing the transfer characteristics, where the maximum extrinsic transconductance achieved was 613 mS/mm at $V_{GS}$=−0.5 V and $V_{DS}$=1.5 V. The device is a depletion-mode transistor with a threshold voltage Vth equal to −1.0 V. The drain current after pinch-off, at $V_{GS}$=−2.5 V and $V_{DS}$=1.5 V, was less than 1.8 mA/mm.

A device performance of 1.0 μm gate-length mHEMTs provided device output and transfer characteristics, as depicted in FIG. 11. The DC current-voltage characteristics of a typical AlInAs/GaInAs mHEMT are shown in FIG. 10. The maximum drain current measured at $V_{GS}$=0.4 V and $V_{DS}$=1.5 V was 760 mA/mm.

Referring to FIG. 12, the reverse gate leakage may seem slightly high because no passivation or plasma treatment was administered. On-wafer S-parameters measurements were carried out on 1.0×100 μm² mHEMTs from 0.1 to 39.1 GHz. Open on-wafer de-embedding structures were used to determine the parasitic capacitances of the probe pads and to de-embed the short circuit current gain |h21|.

Figure 13:
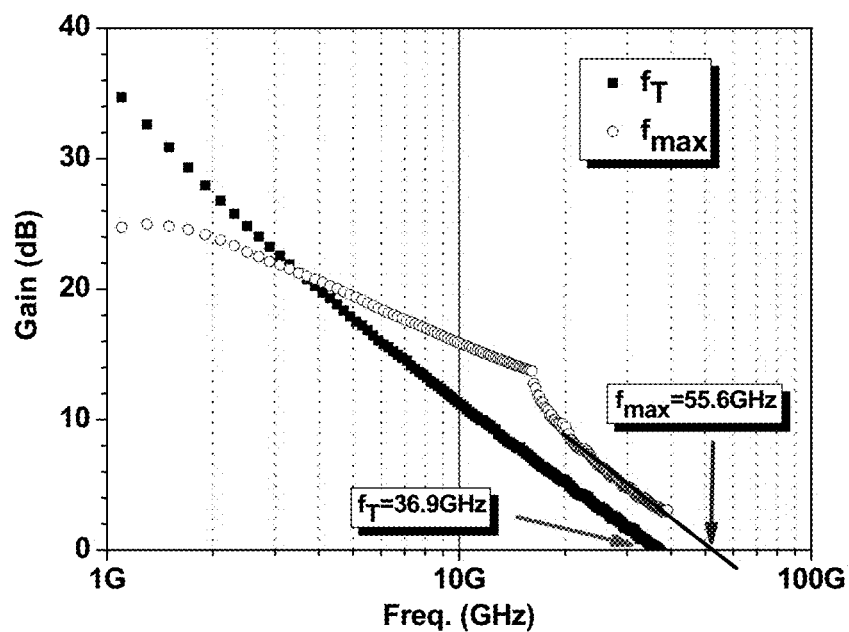
FIG. 13 is a graphic depiction of current gain and MSG/MAG as a function of frequency for a mHEMT.

FIG. 13 is a graphic depiction of current gain and MSG/MAG as a function of frequency for a 1.0×100 μm² mHEMT. The diagram shows the current gain and MSG/MAG as a function of frequency for 1.0×100 μm² mHEMTs. The current gain cut-off frequency ($f_T$) was 36.9 GHz. Extrapolating the de-embedded data from 39.1 GHz at −20 dB/decade resulted in $f_{max}$ of 55.6 GHz. The optimum bias condition for maximum unity current gain cut-off frequency was determined to be $V_{GS}$=−0.4 V and $V_{DS}$=1.5 V.

Figure 14:
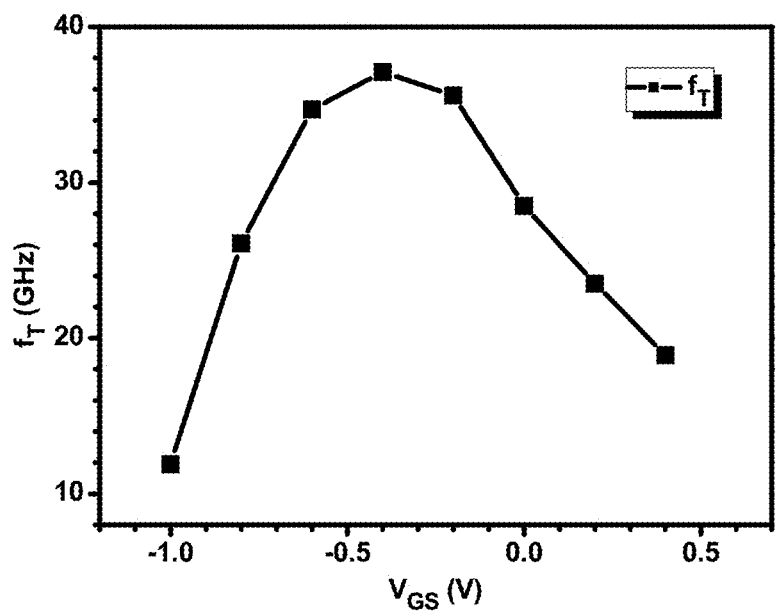
FIG. 14 is a graphic depiction of small-signal characteristics of a mHEMT.

FIG. 14 is a graphic depiction of small-signal characteristics of a 1.0×100 μm² mHEMT with $V_{GS}$ varying from −1.0 to 0.4 V. The diagram shows the dependencies of fT on gate bias, where $V_{DS}$ was fixed at 1.5 V. The figure shows small-signal characteristics of a 1.0×100 μm² mHEMT with $V_{GS}$ varying from −1.0 to 0.4 V.

Device Performance of 0.3 μm Gate-Length mHEMTs

Figure 15:
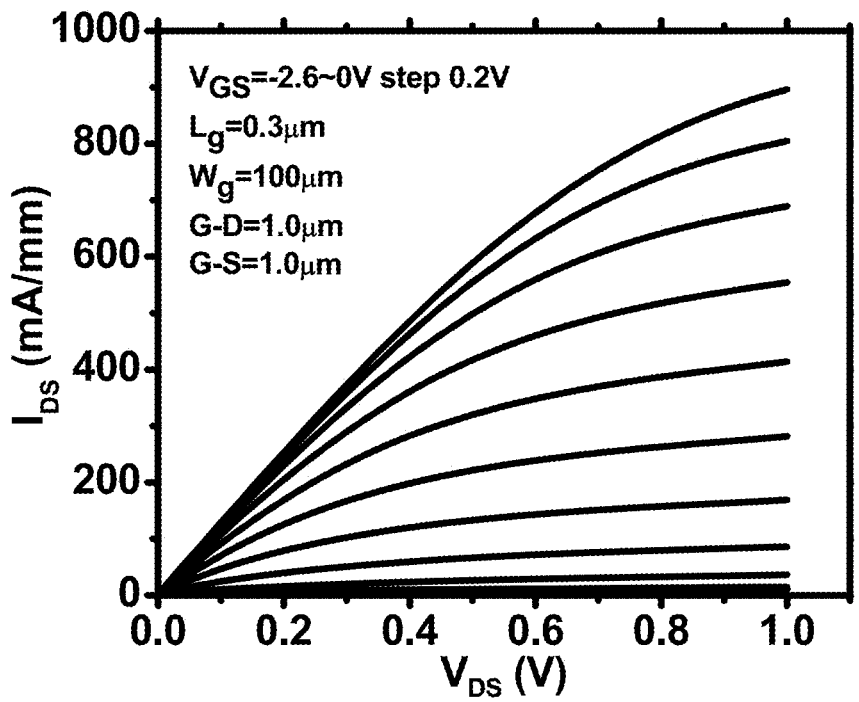
FIG. 15 is a graphic depiction of DC current-voltage characteristics of a mHEMT.

Device output and transfer characteristics of 0.3 μm gate-length mHEMTs were obtained. FIG. 15 is a graphic depiction of DC current-voltage characteristics of a 0.3×100 μm² mHEMT. The DC current-voltage characteristics are taken for a typical AlInAs/GaInAs mHEMT. The maximum drain current measured at $V_{GS}$=0 V and $V_{DS}$=1.0 V was 900 mA/mm. The device has a maximum extrinsic transconductance of 739 mS/mm shown in FIG. 4, and a go of 107 mS/mm. The voltage gain, gm/go, is 6.9. The output conductance is a little large, which can improve by optimizing the device structure, such as a larger gate-drain gap Lgd. The device is a depletion-mode transistor with a threshold voltage Vth of around −1.4 V.

Figure 16:
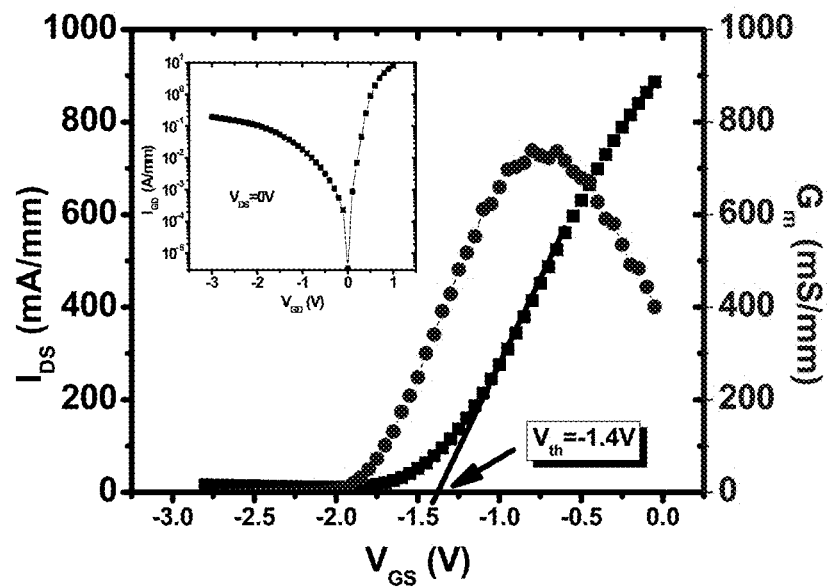
FIG. 16 is a graphic depiction of transfer characteristics of a mHEMT.

FIG. 16 is a graphic depiction of transfer characteristics of a 0.3×100 μm² mHEMT, with the inset showing the gate leakage current characteristics of the mHEMT such as is shown in FIG. 12 (for a different mHEMT). The reverse gate leakage may seem slightly high because no passivation or plasma treatment was administered.

Figure 17:
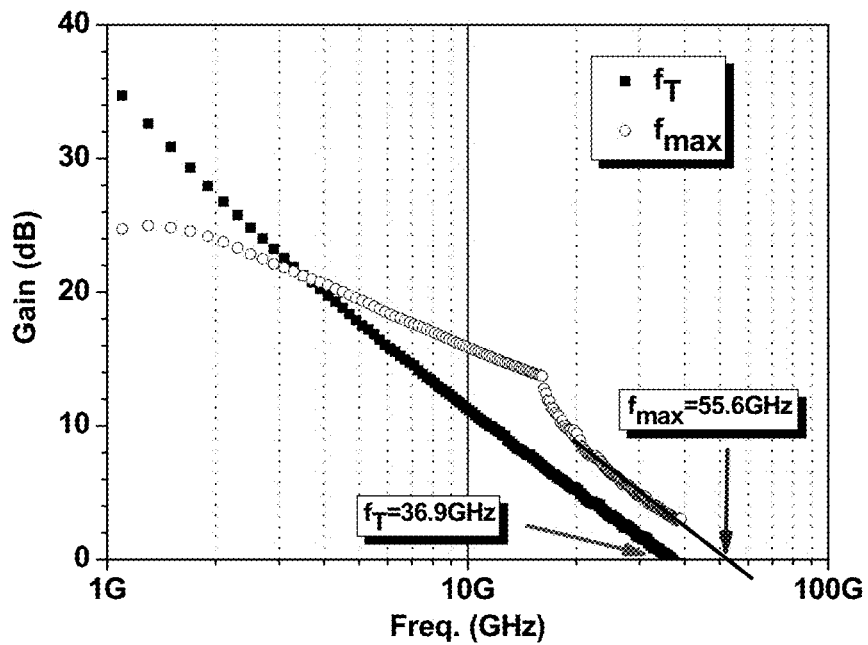
FIG. 17 is a diagram showing the current gain and MSG/MAG as a function of frequency, obtained by extrapolation from the plot.

FIG. 17 is a diagram showing the current gain and MSG/MAG as a function of frequency for 0.3×100 μm² mHEMTs. The current gain cut-off frequency (fT) was 72.4 GHz. Extrapolating the de-embedded data from 39.1 GHz at −20 dB/decade resulted in fmax of 77.8 GHz. The optimum bias condition for maximum unity current gain cut-off frequency was determined to be $V_{GS}$=−0.9 V and $V_{DS}$=1.0 V. An InPut capacitance to gate-drain feedback capacitance ratio, Cgs/Cgd, is 6.8, which was determined by equivalent circuit modeling of measured 5-25 GHz S-parameters.

Figure 18:
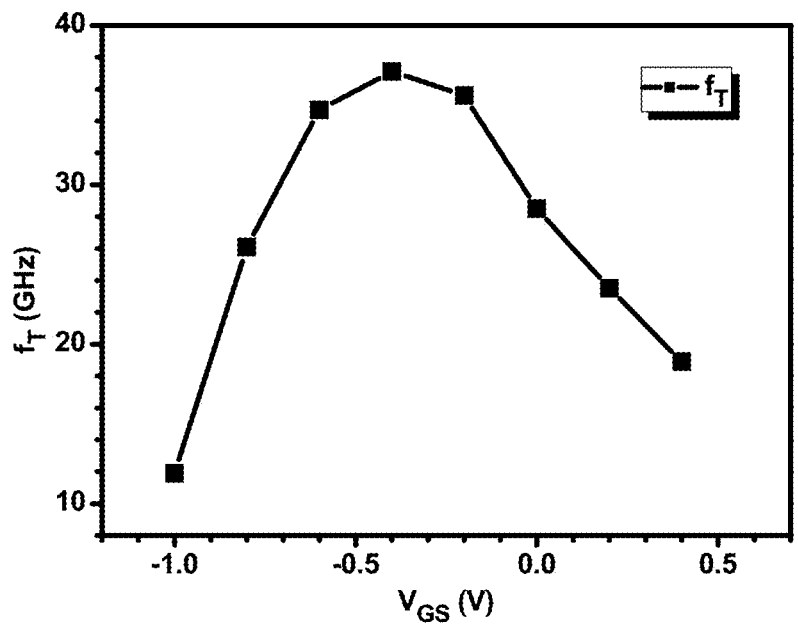
FIG. 18 is a graphic depiction of the maximum values of $f_T$ and $f_{max}$ at different gate-source bias voltage.

FIG. 18 is a graphic depiction of the values of $f_T$ and $f_{max}$ at different gate-source bias voltage. The values of $f_T$ and $f_{max}$ are of Si-mHEMT on gate-source bias voltage measured at $V_{DS}$=1.0 V.

Device Performance of 0.1 μm Gate-Length mHEMTs

Figure 19:
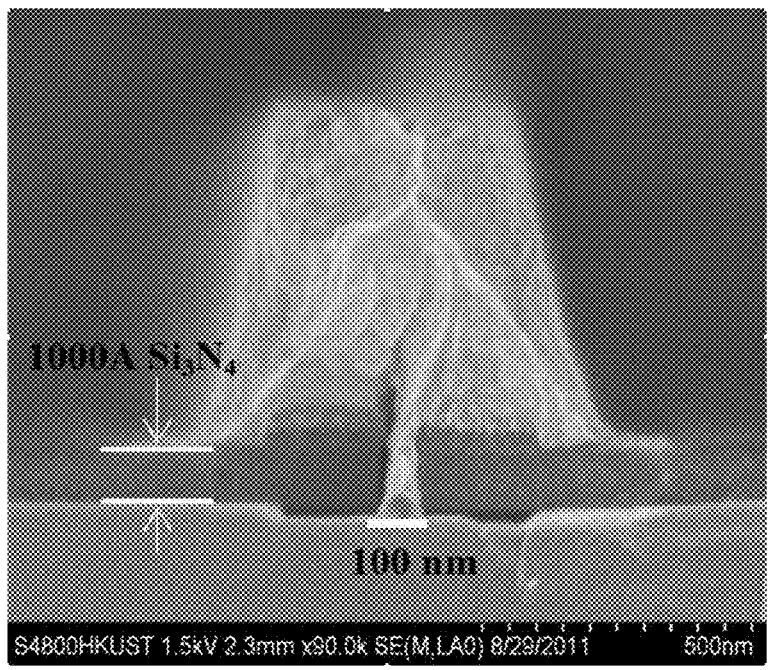
FIG. 19 is a TEM cross-section micrograph of mHEMT structure.

FIG. 19 is a TEM cross-section micrograph of mHEMT structure, in which a T-shape gate device features 0.1 μm gate-length. Device output and transfer characteristics of 0.1 μm gate-length, the maximum measured drain current was about 860 mA/mm at $V_{GS}$=0.6 V and $V_{DS}$=1.5 V. The maximum extrinsic transconductance was 767 mS/mm at $V_{GS}$=0 V and $V_{DS}$=1.0 V. The device is a depletion-mode transistor with a threshold voltage $V_{th}$ around −0.45 V. The drain current below threshold was less than 0.32 mA/mm at $V_{GS}$=−1.2 V and $V_{DS}$=1.0 V.

Figure 20A:
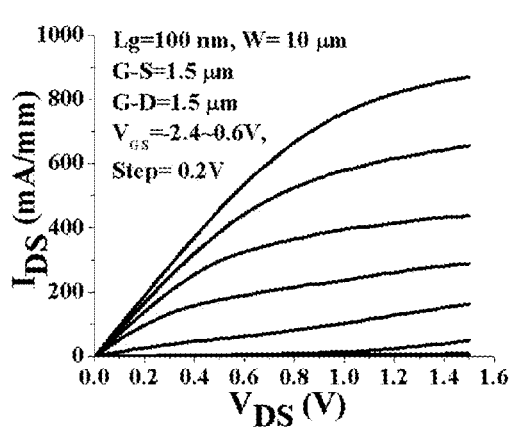
FIGS. 20A-20C are graphical depictions showing DC current-voltage characteristics (FIG. 20A) and transfer characteristics (FIG. 20B) of a mHEMT.
Figure 20B:
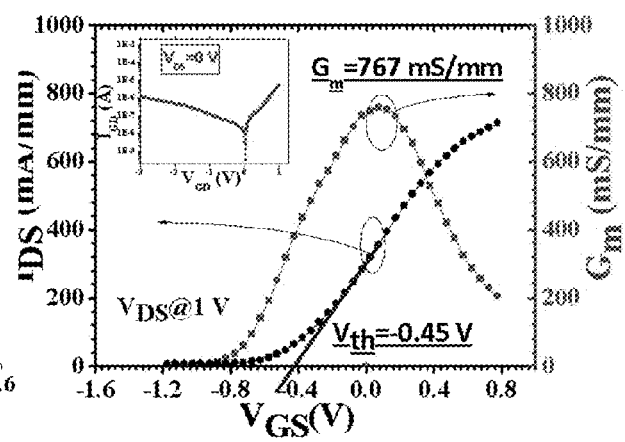
Figure 20C:
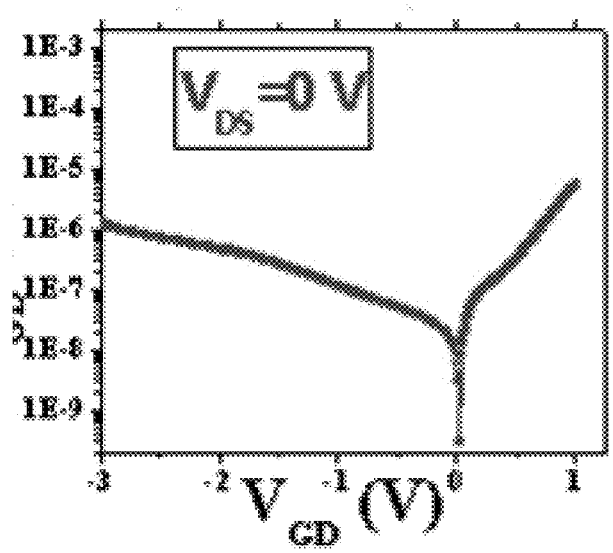

FIGS. 20A-20C are graphical depictions showing DC current-voltage characteristics (FIG. 20A) and transfer characteristics (FIG. 20B) of a 0.1×10 μm² mHEMT. The gate leakage current of the mHEMTs was shown in the inset of FIG. 20B. The reverse gate current is about 0.12 mA/mm at $V_{GS}$=−3 V and $V_{DS}$=1.0 V.

Figure 21:
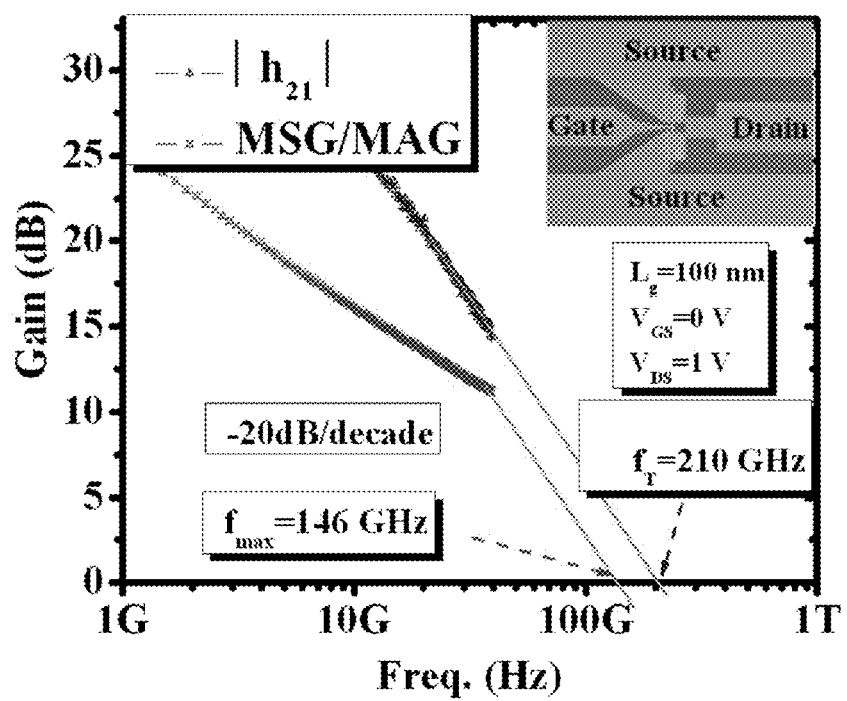
FIG. 21 is a graphical depiction of a cross-sectional SEM graph and current gain MSG/MAG as a function of frequency.

FIG. 21 is a graphical depiction of a cross-sectional SEM graph and current gain MSG/MAG as a function of frequency of a 0.1×100 μm² T-shaped gate mHEMT. As shown in FIG. 20, the cutoff frequency $f_T$ is about 210 GHz from the extrapolation of $|h_{21}|$ to unity using a −20 dB/dec. slope, which is the highest value reported for mHEMTs on Si substrate by MOCVD. The maximum oscillation frequency $f_{max}$ is about 146 GHz from the extrapolation of MSG/MAG.

CONCLUSION

By use of the above techniques, metamorphic AlInAs/GaInAs HEMTs on silicon substrates grown by MOCVD have been fabricated successfully.

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for manufacturing a III-V semiconductor device on a silicon substrate, the method comprising:
   preparing a silicon (Si) substrate;
   treating the substrate to form a stable As—Si prelayer on the substrate;
   applying at least one III/V semiconductor layer comprising a layer of gallium arsenide (GaAs)
   forming a thin strain GaInAs layer;
   applying at least one layer of a second III/V semiconductor material comprising a layer of indium phosphide (InP);
   applying at least one layer of a material having a larger bandgap than said at least one III/V semiconductor layer, the material having a larger bandgap comprising a layer of aluminum indium arsenide (AlInAs), thereby forming a composite multi-layer buffer structure of AlInAs over InP over the strain layer over InP over GaAs over Si;
   applying at least one layer of a material having a high electron mobility and small bandgap than said at least one III/V semiconductor layer, the material having a high electron mobility and small bandgap comprising a layer of Gallium indium arsenide (GaInAs), thereby forming a structure of GaInAs over AlInAs over InP over the strain layer over InP over GaAs over Si;
   applying at least one layer of a material having a larger bandgap than said at least one III/V semiconductor layer, the material having a larger bandgap comprising a layer of aluminum indium arsenide (AlInAs), thereby forming a structure of AlInAs over GaInAs over AlInAs over InP over the strain layer over InP over GaAs over Si;
   doping at least a portion of the structure, thereby forming a delta-doped layer at the AlInAs over GaInAs over AlInAs over InP over the strain layer over InP over GaAs over Si, the delta-doped layer providing an electron carrier supply to a channel layer of GaInAs over the composite multi-layer buffer structure;
   applying at least one layer of a material having a larger bandgap than said at least one III/V semiconductor layer, the material having a larger bandgap comprising a layer of aluminum indium arsenide (AlInAs), thereby forming a structure of AlInAs over delta-doped layer over AlInAs over GaInAs over AlInAs over InP over the strain layer over InP over GaAs over Si;
   applying at least one of a cap layer, thereby forming a heavy doped layer of GaInAs over AlInAs, as a contact layer, thereby forming a structure of heavy doped GaInAs over AlInAs over delta-doped layer over AlInAs over GaInAs over AlInAs over InP over the strain layer over InP over GaAs over Si
   growing an MHEMT structure over the composite multi-layer buffer structure, providing quantum well channel HEMT device layers, or as active layers, to form a structure of heavy doped GaInAs over AlInAs over delta-doped layer over AlInAs over GaInAs over composite buffers; and
   forming mesa isolation by wet chemical etching down to the buffer down to the layer of AlInAs that is over InP over the strain layer over InP over GaInAs over InP over GaAs over Si.

2. The method of claim 1, further comprising:
   applying active layers or MHEMT structure over the structure of AlInAs over InP over GaAs over Si, as multilayers of MHEMT structure, quantum well channel HEMT device layers, thereby providing a structure of heavy doped GaInAs over AlInAs over delta-doped layer over AlInAs over GaInAs over AlInAs over InP over the strain layer over InP over GaAs over Si.

3. The method of claim 1, further comprising:
   using, as said III/V semiconductor layer, a layer of gallium arsenide (GaAs).

4. The method as described in claim 3, wherein the treating of the substrate to form a stable As—Si prelayer comprises:
   after preparing the silicon substrate, cooling the substrate under $H_2$ ambient; and
   exposing the substrate to arsine, thereby forming double monolayer steps on a surface of the silicon substrate as well as the stable As—Si prelayer.

5. The method as described in claim 4, further comprising:
   forming the metallic source/drain ohmic contacts by use of electron beam evaporation to form multiple metallic layers;
   using the electron beam evaporation to form gate contacts to effect evaporation of the metal layers of Titanium (Ti)/Platinum (Pt)/Gold (Au), with wet chemical etching selectively etching only the GaInAs over AlInAs; and
   forming the metallic source/drain ohmic contacts by use of electron beam evaporation to form multiple metallic layers of Nickel (Ni)/Germanium (Ge)/Gold (Au)/Germanium (Ge)/Nickel (Ni)/Gold (Au).

6. The method of claim 1, further comprising:
using, as said III/V semiconductor layer, a layer of gallium arsenide (GaAs);
using, as the second III/V semiconductor material, a layer of indium phosphide (InP); and
applying, as said layer of a material having a larger bandgap, a layer of aluminum indium arsenide (AlInAs), forming a composite buffer layer structure of AlInAs over InP over the strain layer over InP over GaAs over Si.

7. The method as described in claim 1, wherein the treating of the substrate to form a stable As—Si prelayer comprises:
after preparing the silicon substrate, cooling the substrate under $H_2$ ambient; and
exposing the substrate to arsine, the arsine helping to form double monolayer steps on a surface of the silicon substrate as well as the stable As—Si prelayer.

8. The method as described in claim 1, wherein the treating of the substrate to form a stable As—Si prelayer comprises:
after preparing the silicon substrate, cooling the substrate to a range within 850° C. to 600° C., under $H_2$ ambient with reactor pressure equal to 100 mbar; and
exposing the substrate to arsine.

9. The method as described in claim 1, wherein:
the doping of at least a portion of the structure comprises delta doping after the application of the structure of AlInAs over GaInAs over AlInAs over InP over the strain layer over InP over GaAs over Si; and
the delta-doped layer applied to the III/V semiconductor layers provides an electron carrier supply to channel layer of the GaInAs located over a composite buffer structure.

10. A method for manufacturing a III V semiconductor device on a silicon substrate, the method comprising:
preparing a silicon (Si) substrate;
treating the substrate to form a stable As—Si prelayer on the substrate;
applying at least one III/V semiconductor layer comprising a layer of gallium arsenide (GaAs);
applying at least one layer of a second III/V semiconductor material comprising a layer of indium phosphide (InP);
forming a thin strain GaInAs layer;
applying at least one layer of a material having a larger bandgap than said at least one III/V semiconductor layer, the material having a larger bandgap comprising a layer of aluminum indium arsenide (AlInAs), thereby forming a composite multi-layer buffer structure of AlInAs over InP over GaInAs over InP over GaAs over Si;
applying at least one layer of a material having a high electron mobility and small bandgap than said at least one III/V semiconductor layer, the material having a high electron mobility and small bandgap comprising a layer of Gallium indium arsenide (GaInAs), thereby forming a structure of GaInAs over AlInAs over InP over GaInAs over InP over GaAs over Si;
applying at least one layer of a material having a larger bandgap than said at least one III/V semiconductor layer, the material having a larger bandgap comprising a layer of aluminum indium arsenide (AlInAs), thereby forming a structure of AlInAs over GaInAs over AlInAs over InP over GaInAs over InP over GaAs over Si;
doping at least a portion of the structure, thereby forming a delta-doped layer at the AlInAs over GaInAs over InP over GaAs over Si, the delta-doped layer providing an electron carrier supply to a channel layer of GaInAs over the composite multi-layer buffer structure;
applying at least one layer of a material having a larger bandgap than said at least one III/V semiconductor layer, the material having a larger bandgap comprising a layer of aluminum indium arsenide (AlInAs), thereby forming a structure of AlInAs over the delta-doped layer over AlInAs over GaInAs over AlInAs over InP over GaInAs over InP over GaAs over Si;
applying at least one of a cap layer, thereby forming a heavy doped layer of GaInAs over AlInAs, as a contact layer, thereby forming a structure of heavy doped GaInAs over AlInAs over GaInAs over AlInAs over GaInAs over InP over GaAs over Si;
growing an MHEMT structure over the composite multi-layer buffer structure, providing quantum well channel HEMT device layers, or as active layers, to form a structure of heavy doped GaInAs over AlInAs over delta-doped layer over AlInAs over GaInAs over a composite multi-layer buffer structure;
forming mesa isolation by wet chemical etching down to the buffer down to the layer of AlInAs that is over InP over GaInAs over InP over GaAs over Si;
using electron beam evaporation to effect evaporation of the metal layers of Nickel (Ni)/Germanium (Ge)/Gold (Au)/Germanium (Ge)/Nickel (Ni)/Gold (Au); and
forming gate recess by selective wet chemical etching through the cap layer, thereby removing the heavy doped layer of GaInAs over AlInAs over delta-doped layer over AlInAs over GaInAs over AlInAs over InP over GaAs over Si.

11. A method for manufacturing a III-V semiconductor device on a silicon substrate, the method comprising:
preparing a silicon (Si) substrate;
treating the substrate to form a stable As—Si prelayer on the substrate;
applying at least one III/V semiconductor layer comprising a layer of gallium arsenide (GaAs);
forming a thin strain GaInAs layer;
applying at least one layer of a second III/V semiconductor material comprising a layer of indium phosphide (InP), resulting in a structure of InP over the strain layer over InP over GaAs over Si;
applying at least one layer of a material having a larger bandgap than said at least one III/V semiconductor layer, the material having a larger bandgap comprising a layer of aluminum indium arsenide (AlInAs), thereby forming a composite multi-layer buffer structure of AlInAs over InP over the strain layer over InP over GaAs over Si;
applying at least one layer of a material having a high electron mobility and small bandgap than said at least one III/V semiconductor layer, the material having a high electron mobility and small bandgap comprising a layer of Gallium indium arsenide (GaInAs), thereby forming a structure of GaInAs over AlInAs over InP over the strain layer over InP over GaAs over Si;
applying at least one layer of a material having a larger bandgap than said at least one III/V semiconductor layer, the material having a larger bandgap comprising a layer of aluminum indium arsenide (AlInAs), thereby forming a structure of AlInAs over GaInAs over AlInAs over InP over the strain layer over InP over GaAs over Si;
doping at least a portion of the structure, thereby forming a delta-doped layer at the GaInAs over AlInAs over InP over the strain layer over InP over GaAs over Si, the delta-doped layer providing an electron carrier supply to a channel layer of GaInAs over the composite multi-layer buffer structure;
applying at least one layer of a material having a larger bandgap than said at least one III/V semiconductor layer, the material having a larger bandgap comprising a layer of aluminum indium arsenide (AlInAs), thereby forming a structure of AlInAs over the delta-doped layer over AlInAs over GaInAs over AlInAs over InP over the strain layer over InP over GaAs over Si; and applying at least one of a cap layer, thereby forming a heavy doped layer of GaInAs over AlInAs, as a contact layer, thereby forming a structure of heavy doped GaInAs over AlInAs over the delta-doped layer over AlInAs over GaInAs over AlInAs over InP over the strain layer over InP over GaAs over Si.

12. The method as described in claim 11, wherein the treating of the substrate to form a stable As—Si prelayer comprises:

after preparing the silicon substrate, cooling the substrate under $H_2$ ambient;

exposing the substrate to arsine, thereby forming double monolayer steps on a surface of the silicon substrate as well as the stable As—Si prelayer;

forming the metallic source/drain ohmic contacts by use of electron beam evaporation to form multiple metallic layers;

using the electron beam evaporation to form gate contacts to effect evaporation of the metal layers of Titanium (Ti)/Platinum (Pt)/Gold (Au), with wet chemical etching selectively etching only the GaInAs over AlInAs; and forming the metallic source/drain ohmic contacts by use of electron beam evaporation to form multiple metallic layers of Nickel (Ni)/Germanium (Ge)/Gold (Au)/Germanium (Ge)/Nickel (Ni)/Gold (Au).

13. The method as described in claim 11, further comprising:

growing, as said composite multi-layer buffer structure, composite buffers on the substrate as said consisting of AlInAs over InP over GaInAs over InP over GaAs over Si;

growing an MHEMT structure over the composite buffers, providing quantum well channel HEMT device layers, or as active layers, to form a structure of heavy doped GaInAs over AlInAs over delta-doped layer over AlInAs over GaInAs over a composite multi-layer buffer structure; and forming mesa isolation by wet chemical etching down to the buffer as said etching down to the layer of AlInAs that is over InP over GaInAs over InP over GaAs over Si;

using electron beam evaporation to effect evaporation of the metal layers of Nickel (Ni)/Germanium (Ge)/Gold (Au)/Germanium (Ge)/Nickel (Ni)/Gold (Au); and forming gate recess by selective wet chemical etching through the cap layer, thereby removing the heavy doped layer of GaInAs over AlInAs over delta-doped layer over AlInAs over GaInAs over AlInAs over InP over the strain layer over InP over GaAs over Si.

* * * * *